United States Patent [19]

Tanaka

[11] Patent Number: 5,515,324
[45] Date of Patent: May 7, 1996

[54] EEPROM HAVING NAND TYPE MEMORY CELL ARRAY

[75] Inventor: Tomoharu Tanaka, Yokohama, Japan

[73] Assignee: Kabushiki Kaisha Toshiba, Kawasaki, Japan

[21] Appl. No.: 305,333

[22] Filed: Sep. 15, 1994

[30] Foreign Application Priority Data

Sep. 17, 1993 [JP] Japan .................................. 5-231675

[51] Int. Cl.$^6$ ........................... G11C 17/00; G11C 16/04
[52] U.S. Cl. ............................... 365/185.09; 365/185.17; 365/185.13; 365/185.22
[58] Field of Search .............................. 365/185, 189.01, 365/200, 201, 205, 210, 218

[56] References Cited

U.S. PATENT DOCUMENTS

| | | | |
|---|---|---|---|
| 4,279,024 | 7/1981 | Schrenk | 365/203 |
| 4,939,690 | 7/1990 | Momodomi et al. | 365/185 |
| 4,943,962 | 7/1990 | Imamiya et al. | 365/230.08 |
| 4,959,812 | 9/1990 | Momodomi et al. | 365/185 |
| 4,996,669 | 2/1991 | Endoh et al. | 365/185 |
| 5,134,583 | 7/1992 | Matsuo et al. | 365/200 |
| 5,148,394 | 9/1992 | Iwahashi | 365/185 |
| 5,172,338 | 12/1992 | Mehrotra et al. | 365/185 |
| 5,297,029 | 3/1994 | Nakai et al. . | |
| 5,299,162 | 3/1994 | Kim | 365/201 |
| 5,357,462 | 10/1994 | Tanaka et al. | 365/185 |
| 5,361,227 | 11/1994 | Tanaka et al. | 365/189.01 |

FOREIGN PATENT DOCUMENTS 2029145 6/1979 United Kingdom .

OTHER PUBLICATIONS

"A 90-ns One-Million Erase/Program Cycle 1-Mbit Flash Memory", Kynett et al., IEEE Journal of Solid-State Circuits, vol. 24, No. 5, Oct. 1989, pp. 1259–1263.

"An In-System Reprogrammable ... ", Kynett et al., IEEE Journal of Solid-State Circuits, vol. 23, No. 5, Oct. 1988, pp. 1157–1163.

SEEQ Databook, 1988/89, SEEQ Technology, Inc., pp. 3-1-3-7.

"Advanced Micro Devices", Bipolar/Mos Memories Data Book, pp. 1-1-6-14 1986 Advanced Micro Devices, Inc.

"A 4-Mbit NAND-EEPROM With Tight Programmed Vt Distribution", Tanaka et al., 1990 Symposium on VLSI Circuits, pp. 105–106.

*Primary Examiner*—David C. Nelms
*Assistant Examiner*—Son Mai
*Attorney, Agent, or Firm*—Oblon, Spivak, McClelland, Maier & Neustadt

[57] ABSTRACT

A NAND-cell type EEPROM comprises a memory cell array in which electrically rewritable memory cells are arranged in a matrix and a plurality of data circuits (R/W circuits in a main bit-line control circuit) for storing data to control the state of the operation of writing data into memory cells in the memory cell array. A bit-line voltage is controlled according to the writing data in the data circuit after data loading. Since the voltage on a bit line with a current leak source changes, an erroneous write operation due to a defective bit line with a current leak can be prevented by setting in the data circuit the data indicating that the bit-line voltage has been sensed after data loading. This makes it possible to effect data loading in a short time after the write mode has turned on, and to provide an easy-to-use NAND-cell type EEPROM with a high relief efficiency of defective bit lines.

20 Claims, 16 Drawing Sheets

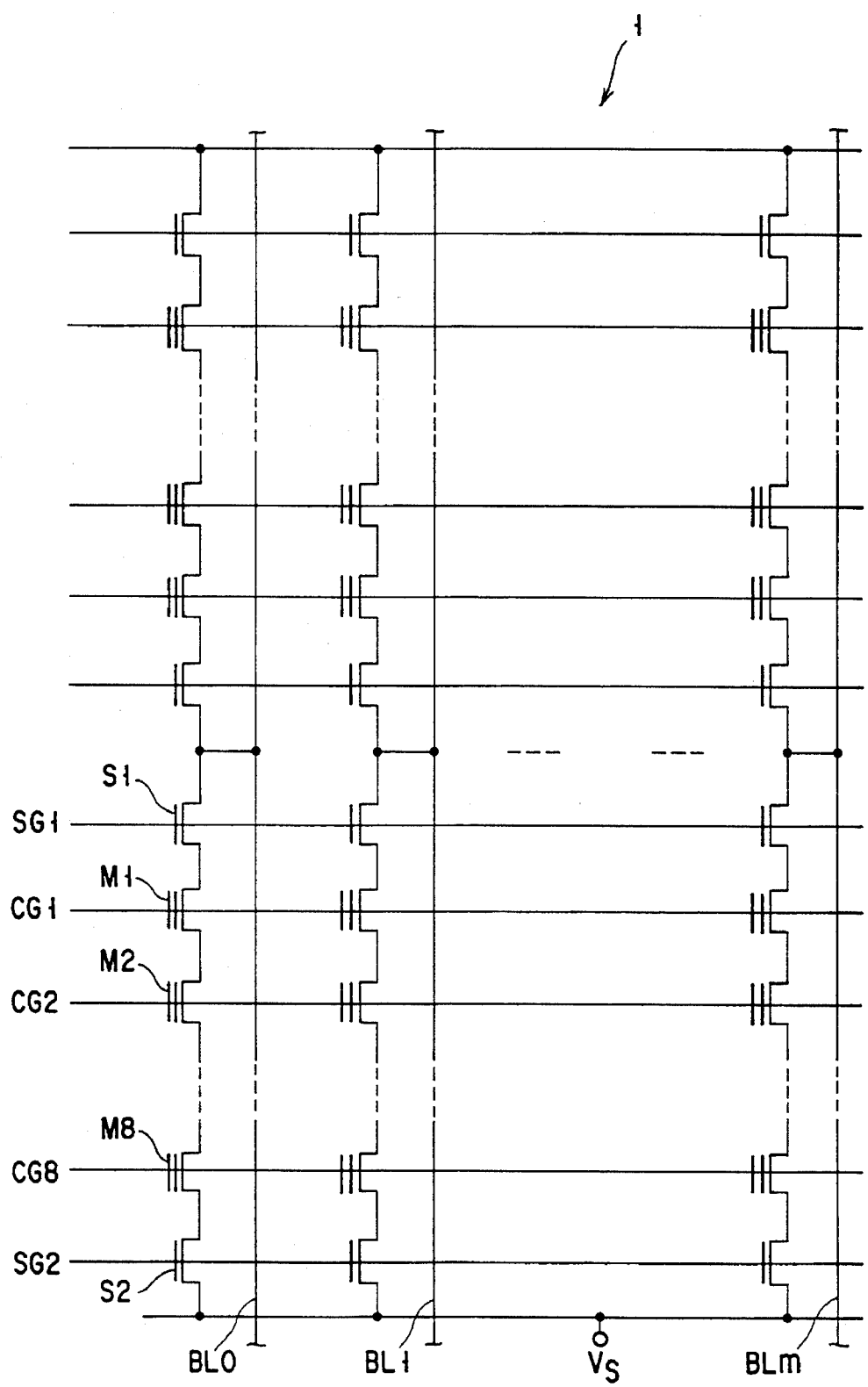
F I G. 2

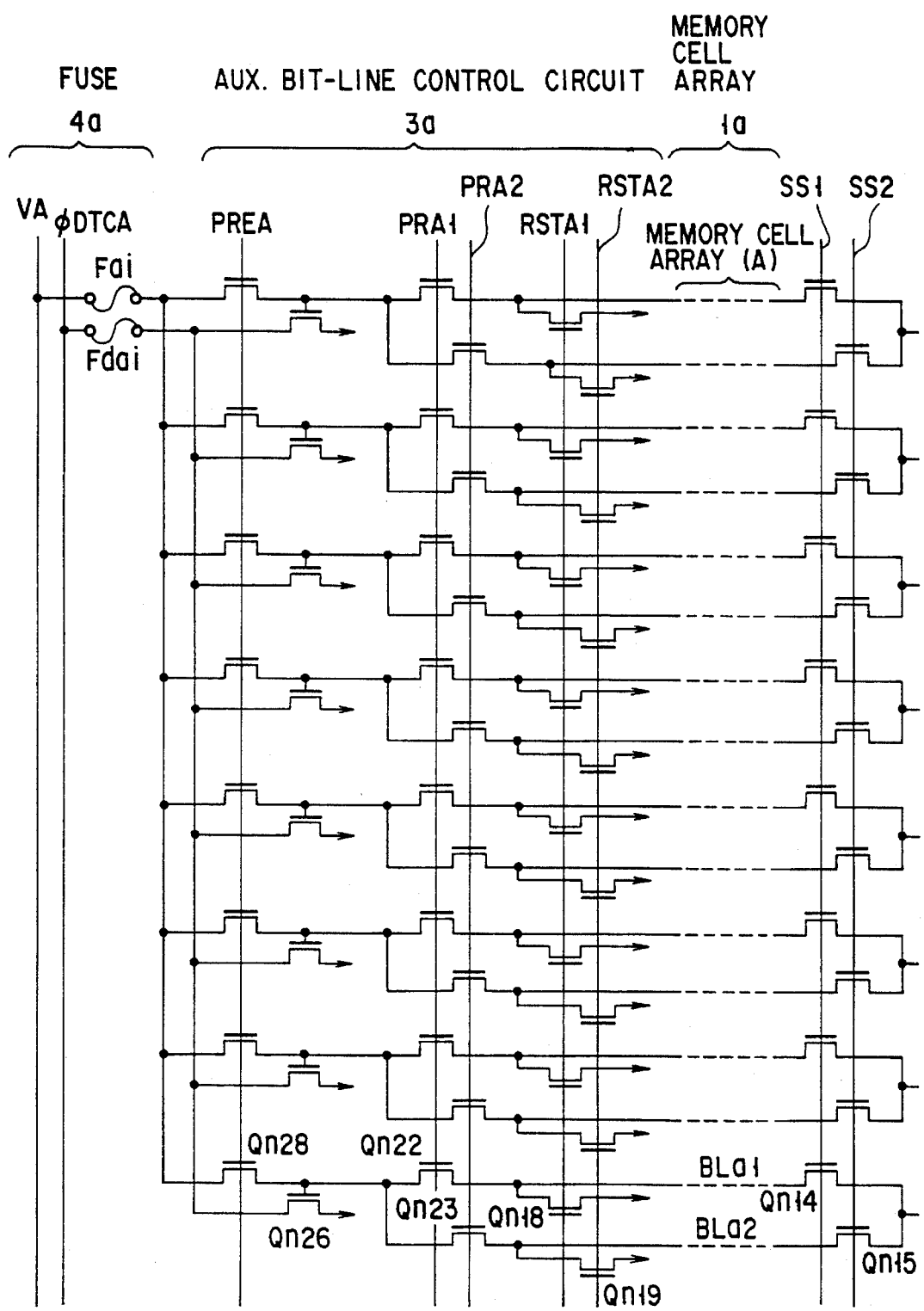
F I G. 3A

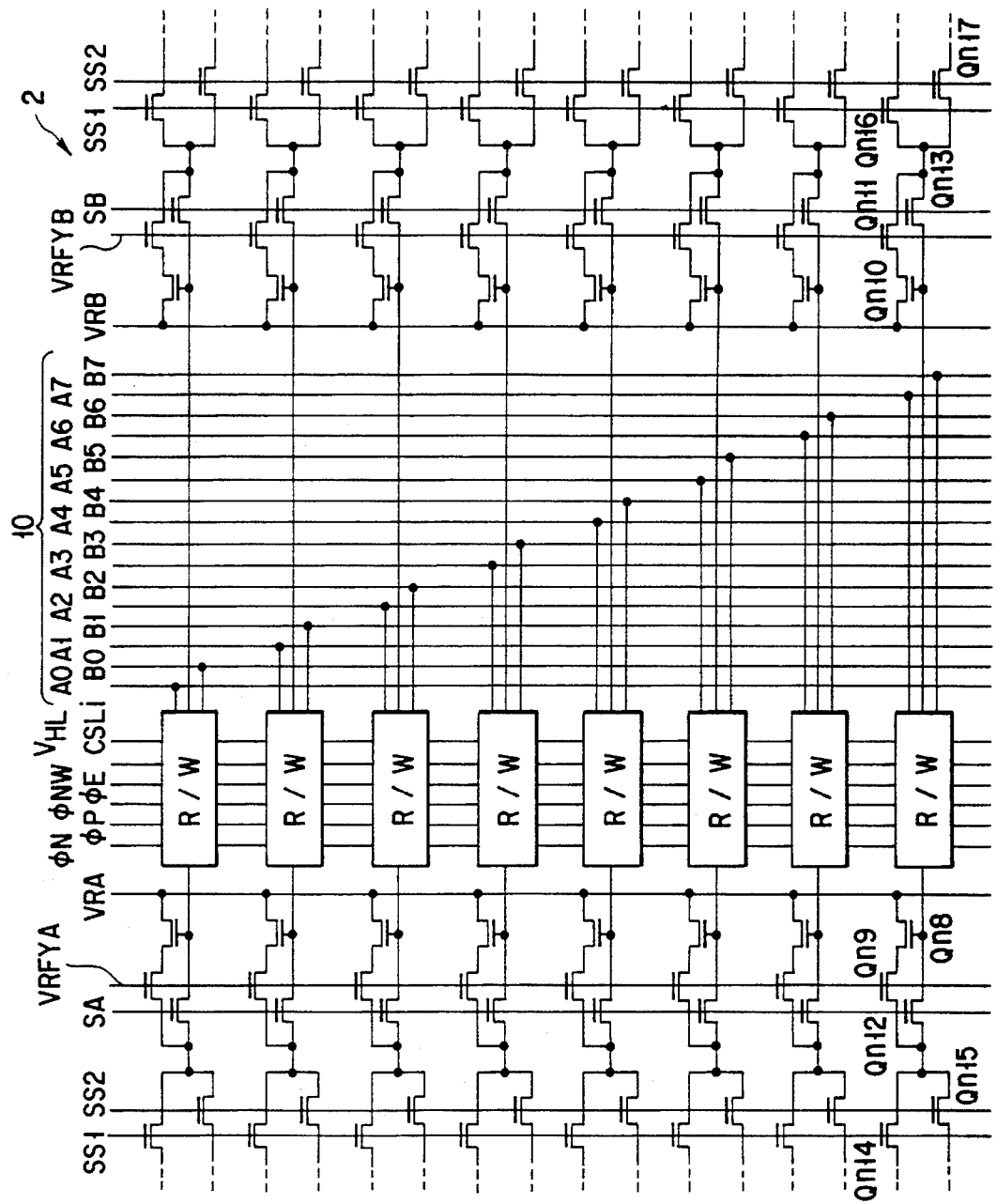
F I G. 3B

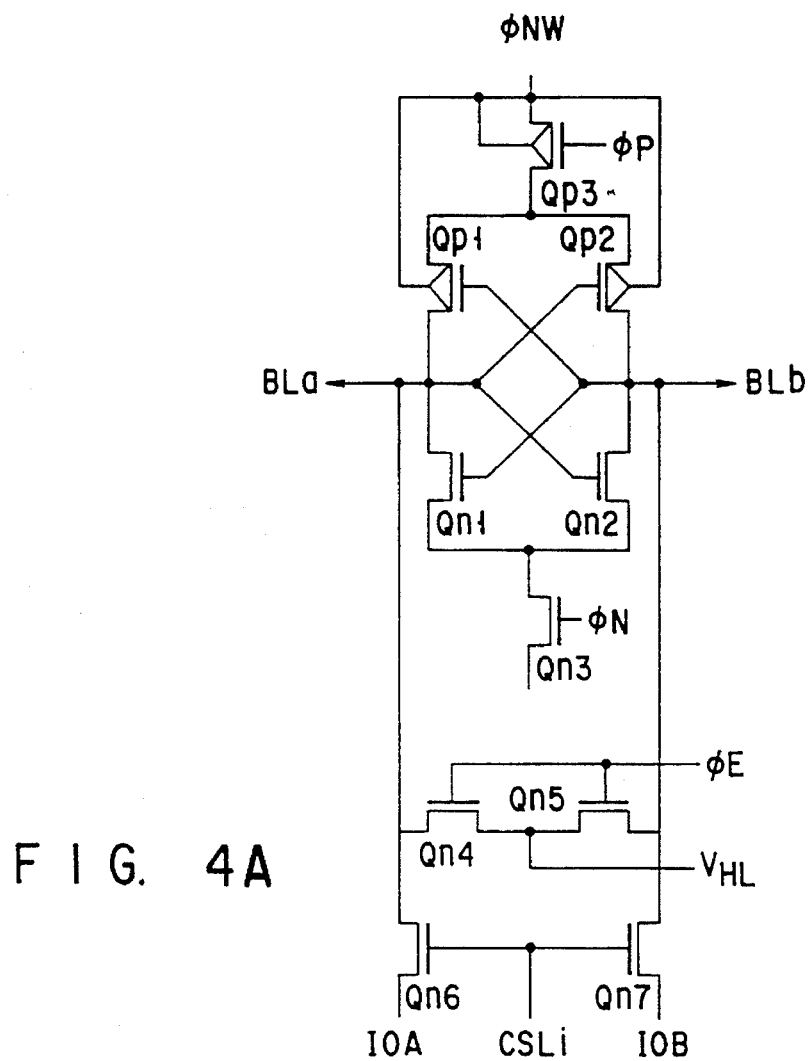
F I G. 4A
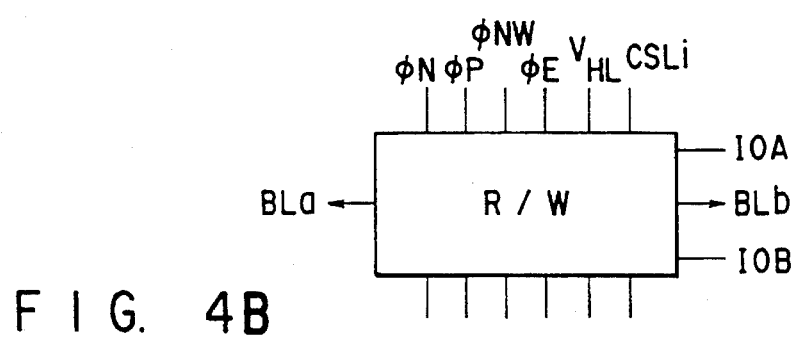
F I G. 4B
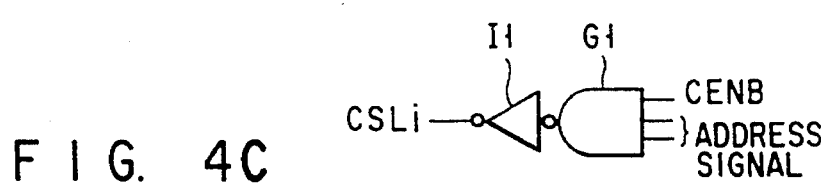
F I G. 4C

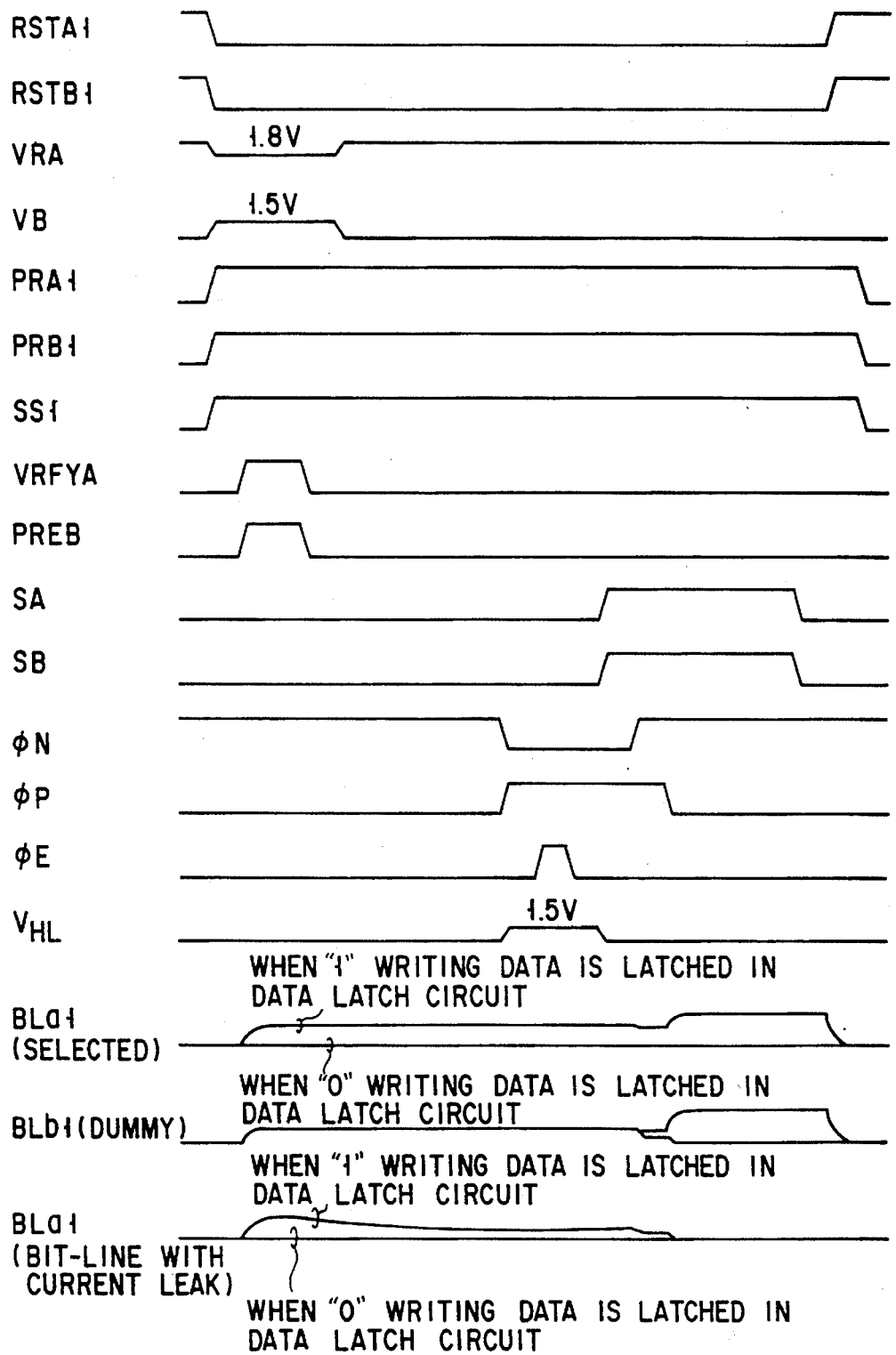
F I G. 9

EEPROM HAVING NAND TYPE MEMORY CELL ARRAY

BACKGROUND OF THE INVENTION

1. Field of the Invention

The present invention relates to an electrically erasable programmable read only memory (EEPROM) and, more particularly, to an EEPROM having a memory cell array composed of NAND cells.

2. Description of the Related Art

Recently, NAND-cell type EEPROMs have been proposed as one type of EEPROMs. The memory cell of the EEPROM has an N-channel FET MOS structure in which a floating gate acting as a charge storage layer and a control gate are stacked in that order. The EEPROM is composed of a plurality of memory cells, which are connected in series in such a manner that the source and drain of each cell are shared by adjacent ones one after another and which are treated as a unit connected to a bit line. The drain side of the NAND cell is connected to a bit line via a first select gate, and the source side is connected to a source line via a second select gate. The control gate and the first and second select gates of the memory cell are placed sequentially in the row direction.

The write operation of the NAND-cell EEPROM type is effected as follows. First, an erase operation makes a threshold value of all memory cells in the NAND cell negative. After this, data is written simultaneously into a plurality of memory cells which share the control gate, starting sequentially with the farthest one from the bit line contact. The control gate of the selected memory cell is applied with a high voltage Vpp (up to nearly 20 V), the control gates of the unselected memory cells are applied with a middle voltage vm10 (up to nearly 10 V), and the bit line is applied with a middle voltage Vm8 (up to nearly 8 V) according to the data. At this time, the first select gate is turned on and the second select gate is turned off. When 0 V is supplied to the bit line, the voltage is transferred to the drain of the selected memory cell, which injects electrons into the floating gate. As a result, the threshold value of the selected memory cell goes positive. This state is determined to be "0", for example. When vm8 is supplied to the bit line, electron injection does not take place. Consequently, the threshold value remains unchanged and holds negative. This state is determined to be "1". Since data are written into a plurality of memory cells simultaneously in this way, data circuits are provided for storing the data to be written. The data circuits are also used to temporarily store the read-out data. To shorten the time required to load data, data are not loaded into the data circuits of the memory cells which do not have to be written. Thus, before data loading, write data "1" is set in the data circuits collectively.

The data is read simultaneously from a plurality of memory cells sharing the control gate by setting the control gate of the selected memory cell at 0 V and setting the control gates of the remaining memory cells at a power supply voltage Vcc (e.g., 3 V), and then sensing whether a current flows through the selected memory cell. The read-out data are stored in the data circuits and then outputted.

To operate the NAND-cell type EEPROM from a single power supply, the voltages Vpp, Vm10, and Vm8 used in the write operation are generated by raising the power supply voltage Vcc by means of an internal circuit. If there is any current leak source at the circuit to be boosted, the voltage multiplexer circuit cannot raise an output voltage potential to a desired voltage potential level since it generally has a small current supply capacity. This is true in a case where the defective column is replaced with a redundant column in a redundant circuit. Because data are written simultaneously into a plurality of memory cells sharing the control gate, the current leak source on the bit line of the defective column prevents the voltage vm8 from raising the desired voltage level, causing an erroneous write operation. On the other hand, there is provided following another method. In the data circuits for storing the writing data to be written into a plurality of memory cells, when the data corresponding to bit lines having the current leak source are loaded, writing data "1" is set in the data circuits before data are loaded, and then writing data "0" is reset in the data circuit before the writing data are loaded into the data circuits.

However, these kinds of methods require time to check the bit line with a current leak source during the time from when the write mode is turned on until data are loaded or before the write mode is turned on. Further, since the checking process cannot be effected automatically, it must be done under the control of the CPU. As a result, the control of the NAND-cell type EEPROM is made complex. As described above, conventional NAND-cell type EEPROMs require time to check bit lines having a current leak source during the time from when the write mode is turned on until data are loaded or before the write mode is turned on. These drawbacks have made them difficult to be used.

SUMMARY OF THE INVENTION

It is an object of the present invention to provide a NAND-cell type EEPROM which enables data loading in a short time after the write mode is turned on, without checking a bit line having a current leak source during the time from when the write mode is turned on until data are loaded or before the write mode is turned on, and which is, therefore, easy to use and has a high relief efficiency of defective bit lines.

According to an aspect of the present invention, there is provided a nonvolatile semiconductor memory device comprising: a memory cell array in which electrically erasable programmable memory cells are arranged in a matrix fashion; a plurality of data circuits for storing data to control a state of a writing operation of the memory cells in the memory cell array; means for detecting at least one defective bit line with a defect of a current leakage after data have been loaded into the data circuits; means for resetting write data corresponding only to the defective bit line among the write data in the data circuits; and means for performing a write operation by controlling the bit line potential for each memory cell in the memory cell array according to the contents of the corresponding data circuit.

According to another aspect of the present invention, there is provided a nonvolatile semiconductor memory device comprising: a memory cell array in which electrically erasable programmable memory cells are arranged in a matrix fashion; a plurality of bit lines coupled to the memory cells; data circuits for storing data including such data as to set a selected bit line of the plurality of bit lines at one of a first write bit-line voltage or a second write bit-line voltage during a write operation, to control writing conditions of the memory cells in the memory cell array; means for detecting at least one defective bit line with a defect of a current leakage after data have been loaded into the data circuits; means for resetting write data corresponding only to the defective bit line among the write data in the data circuits to such data as to set a bit line at one of the first write bit-line voltage or the second bit-line voltage during a write operation; and means for performing a write operation by controlling the bit line potential for each memory cell in the memory cell array according to the contents of the corresponding data circuit.

According to still another aspect of the present invention, there is provided a nonvolatile semiconductor memory device comprising: a memory cell array in which electrically erasable programmable memory cells are arranged in a matrix fashion; a plurality of data circuits for storing data to control writing conditions of the memory cells in the memory cell array and for sensing the voltages on bit lines of the memory cell array and storing the sensed voltages again; means for detecting at least one defective bit line with a defect of a current leakage after data have been loaded into the data circuits; means for replacing the contents of the data circuits corresponding only to the defective bit lines with a current leak with such a data item as causes the write operation performing means to set the bit line at the first write bit-line voltage during a write operation, and not changing the contents of the data circuits corresponding to the bit lines with no current leakage when the data circuits sense the voltages on the bit lines and store the sensed voltages again; and means for performing a write operation by controlling the bit line potential for each memory cell in the memory cell array according to the contents of the corresponding data circuit.

In the present invention, a bit line with a current leak source is automatically checked after data are loaded, and a write operation is immediately followed, without checking a bit line having a current leak source during the time from when the write mode is turned on until data are loaded or before the write mode is turned on, unlike the conventional NAND-cell type EEPROM. Specifically, in the present invention, since the voltage on the bit line with the current leak source is changed when the bit-line voltage is controlled according to the write data in the data circuits after data are loaded, the data obtained by sensing the bit-line voltage can be reset in the data circuits as the write data after the current leakage time has elapsed. Using the same example as explained in the prior art, an explanation will be given. When the write data in the data circuits is "0" after data are loaded, the bit line is brought into a low floating state. While, when the write data in the data circuits is "1", the bit line is forced to a high floating state. Since the high floating state of the bit line with the current leak source is changed to a low level, the data obtained by sensing the bit-line voltage is set in the data circuits as a writing data item after the current leakage time has elapsed. In this way, since the bit line with the current leak source is automatically checked after data loading and the write operation is immediately followed, the data loading can be effected in a short time after the write mode has turned on. Therefore, it is possible to realize an easy-to-use NAND-cell type EEPROM having a high relief efficiency of defective bit lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is an equivalent circuit diagram of a memory cell array according to an embodiment of the present invention;

FIG. 3A is a concrete circuit diagram of a memory cell array, an auxiliary bit-line control circuit, and a bit-line relief fuse according to an embodiment of the present invention;

FIG. 3B is a concrete circuit diagram of a main bit-line control circuit according to an embodiment of the present invention;

FIGS. 4A to 4C are concrete circuit diagrams of the R/W circuit in a main bit-line control circuit according to an embodiment of the present invention;

FIG. 9 is a timing chart for the operation of sensing a leakage current from a defective bit line in an embodiment of the present invention;

DETAILED DESCRIPTION OF THE PREFERRED EMBODIMENT

An embodiment of the present invention will be explained hereinafter referring to the accompanying drawings.

Figure 1:
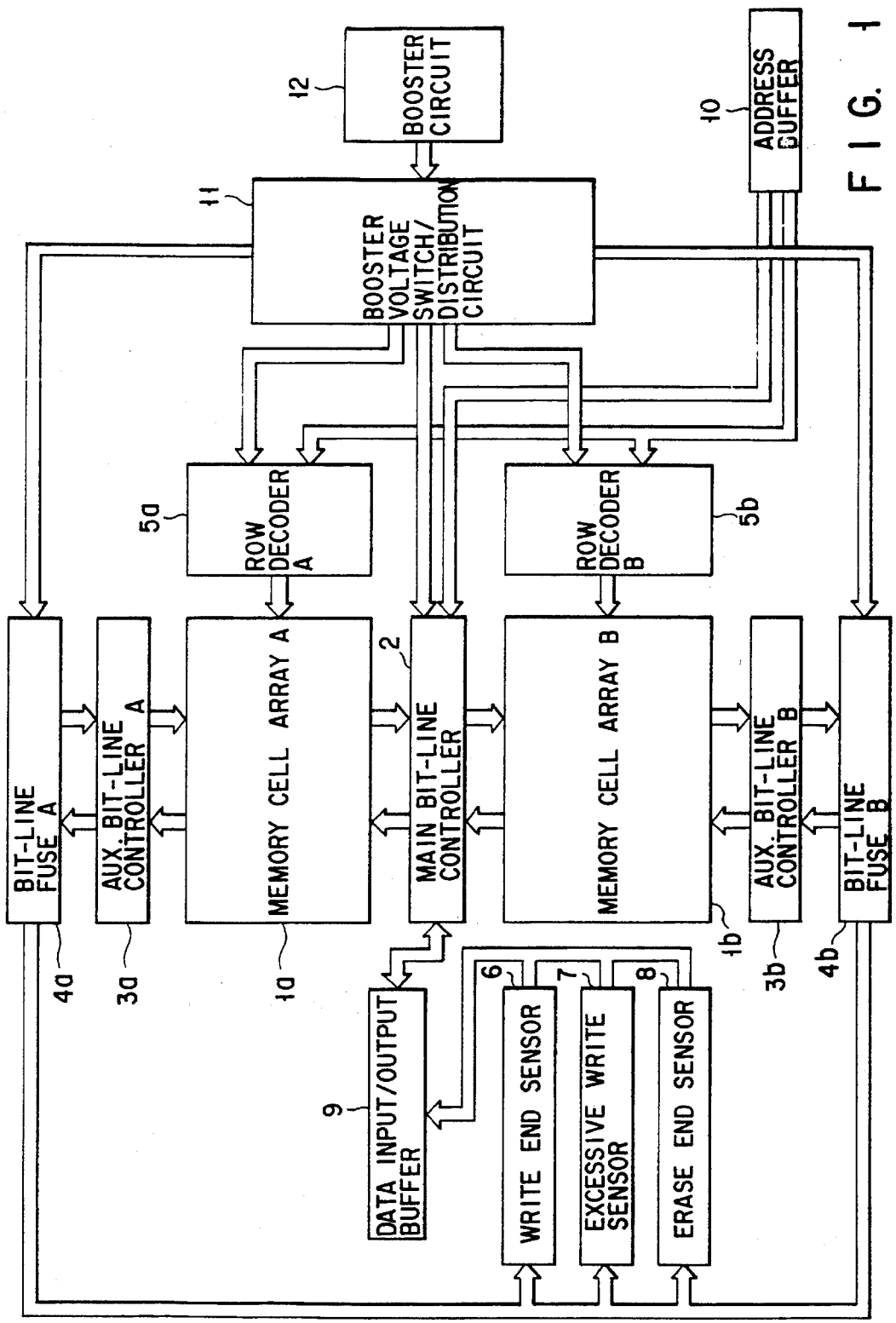
FIG. 1 is a schematic block diagram of a NAND-cell type EEPROM according to an embodiment of the present invention.

FIG. 1 is a schematic block diagram of a NAND-cell type EEPROM according to an embodiment of the present invention. Memory cell arrays 1a, 1b divided into a part A and a part B is provided with a main bit-line control circuit 2 for data writing, reading, rewriting, and verify-reading. The main bit-line control circuit 2 is connected to a data input/ output buffer 9 and receives an address signal from an address buffer 10. Auxiliary bit-line control circuits 3a, 3b for charging/discharging the bit line as desired in a write or a read operation and sensing a write end/excessive writing/ an erase end from the potential of the bit line are provided for the memory cell arrays 1a, 1b, respectively. The auxiliary bit-line control circuits 3a, 3b are connected via bit-line fuses 4a, 4b respectively to a write end sensing circuit 6, an excessive write sensing circuit 7, and an erase end sensing circuit 8. The memory cell arrays 1a, 1b are provided with row decoders 5a, 5b for controlling control gates and select gates, respectively. The row decoders 5a, 5b receive address signals from an address buffer 10. A booster voltage switch and distribute circuit 11 supplies the output of a booster circuit 12 for generating a high voltage necessary for data rewriting to the main bit-line control circuit 2, the auxiliary bit-line control circuits 3a, 3b, and the row decoders 5a, 5b. A high voltage necessary for data rewriting is supplied to the auxiliary bit-line control circuits 3a, 3b via the bit-line fuses 4a, 4b, respectively.

FIG. 2 shows an equivalent circuit of a memory cell array 1 composed of NAND cells arranged in a matrix form. Explanation will be given, centering around a single NAND cell. In this embodiment, eight memory cells M1 to M8 are connected in series, with the drain side of the NAND cells connected to a bit line BL0 via a select transistor S1 and their source side connected to a source line Vs via a select transistor S2. The control gates and select gates of NAND cells arranged in a row are wired by control gate lines CG1 to CG8 and select gate lines SG1 and SG2 common to these cells. In this embodiment, memory cells and select transistors are N-channel MOS transistors.

Figure 3C:
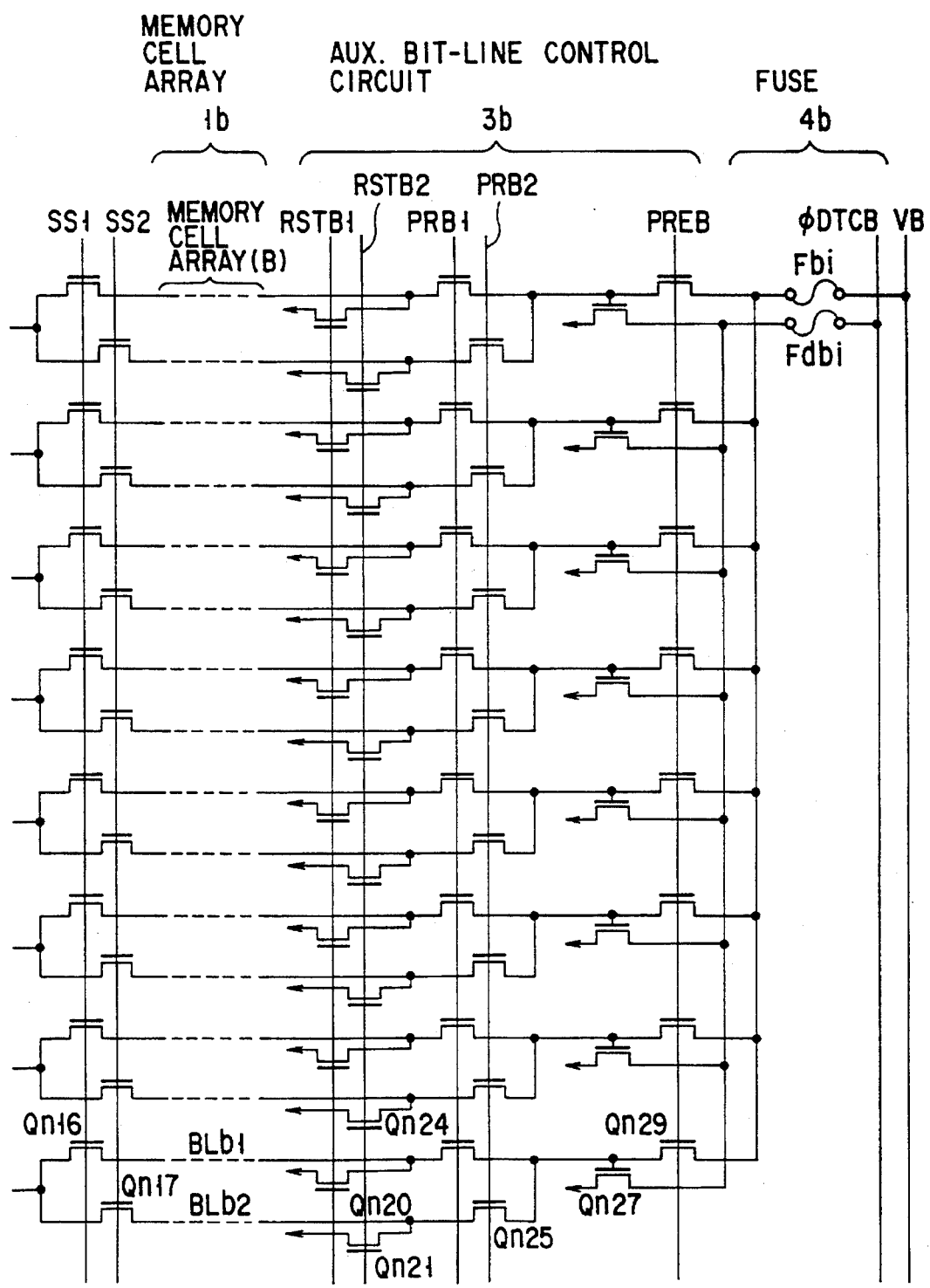
FIG. 3C is a concrete circuit diagram of a memory cell array, an auxiliary bit-line control circuit, and a bit-line relief fuse according to an embodiment of the present invention.

FIGS. 3A to 3C are circuit diagrams showing concrete structures of the main bit-line control circuit 2, the auxiliary bit-line control circuits 3a, 3b, and the bit-line fuses 4a and 4b in FIG. 1. FIGS. 3A to 3C show a continuous circuit when they are taken together. FIGS. 3A and 3C show the memory cell array 1a, 1b, auxiliary bit-line control circuit 3a, 3b, and bit-line fuse 4a, 4b, respectively. FIG. 3B shows the main bit-line control circuit 2. To simplify explanation of the circuit configuration, only portions related to data input/ output lines IOA7 and IOB7 (FIG. 3B), i.e., the lower end portion in FIGS. 3A to 3C, in the main bit-line control circuit 2 and auxiliary bit-line control circuits 3a, 3b will be described. The read/write circuit (hereinafter, abbreviated as the R/W circuit) in the main bit-line control circuit 2 is shown in FIG. 4B. As shown in FIG. 3B, E (enhancement) type N-channel MOS transistors Qn8, Qn9 and Qn10, Qn11 set a voltage to bit line BL according to the data latched in the R/W circuit. E type N-channel MOS transistors Qn12, Qn14, Qn15 and E type N-channel MOS transistors Qn13, Qn16, Qn17 selectively connect the R/W circuit to bit lines BLa1, BLa2 and bit lines BLb1, BLb2. E type N-channel MOS transistors Qn18, Qn19 and E type N-channel MOS transistors Qn20, Qn21 in auxiliary bit-line control circuits 3a, 3b in FIGS. 3A and 3C connect bit lines BLa1, BLa2, BLb1, BLb2 to the ground. Furthermore, E type N-channel MOS transistors Qn22, Qn23, Qn28 and E type N-channel MOS transistors Qn24, Qn25, Qn29 selectively charge bit lines BLa1, BLa2 and BLb1, BLb2. E type N-channel MOS transistors Qn26, Qn27 are provided to sense a write end, excessive writing, or an erase end from the potential on bit line BL. The bit-line fuses 4a, 4b are composed of four fuses Fai, Fdai, Fbi, Fdbi for a bit line selected by column select signal CSLi, and remedy an erroneous operation due to a defective bit line. The fuses Fai, Fbi prevent charging voltages VA, VB from dropping due to a defective bit line.

The fuses Fdai, Fdbi prevent a write end, excessive writing, or an erase end from being sensed erroneously due to a defective bit line or a defective memory cell. For instance, if the bit line selected by column select signal CSLi in memory cell array 1a, or the memory cell connected to the bit line is defective, fuses Fai, Fdai, Fdbi are cut off.

FIG. 4A is a circuit diagram showing concretely the R/W circuit of FIG. 4B (FIG. 3B). As shown in FIG. 4A, the R/W circuit in the main bit-line control circuit 2 comprises a flip-flop composed of E type N-channel MOS transistors Qn1, Qn2, Qn3 and E type P-channel MOS transistors Qp1, Qp2, Qp3, an equalizer circuit composed of E type N-channel MOS transistors Qn4, Qn5, and a column select gate composed of E type N-channel MOS transistors Qn6, Qn7. The column select gate composed of the E type N-channel MOS transistors Qn6, Qn7 receives the output column select signal CSLi from a column decoder and selectively connects the flip-flop to data input/output lines IOA and IOB. As shown in FIG. 4C, the column decoder is made up of a NAND circuit G1 to which an address signal and a column select activating signal CENB are supplied, and an inverter circuit I1.

Figure 5:
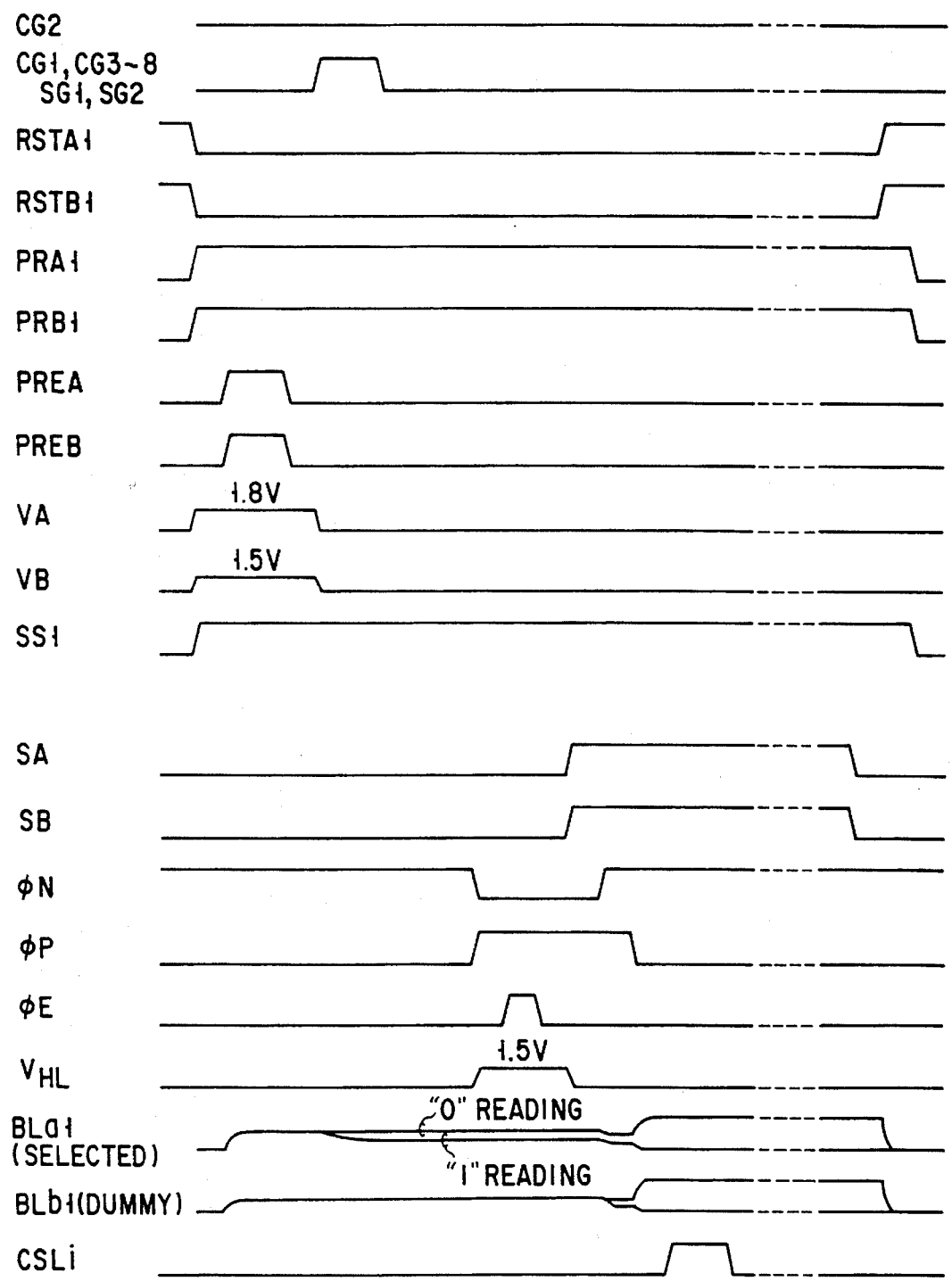
FIG. 5 is a timing chart for the read operation in an embodiment of the present invention.

With reference to a timing chart in FIG. 5, a read operation of the EEPROM thus constructed will be described. It is assumed that the bit line BLa1 in the memory cell array 1a has been selected. In this case, the bit line BLb1 in the memory cell array 1b is used as a dummy bit line. Furthermore, the control gate CG2 is assumed to have been selected. Bit-line reset signals RSTA1, RSTB1 go low, auxiliary bit-line precharge signals PRA1, PRB1 and auxiliary bit-line select signal SS1 go high, and main bit-line precharge signals PREA, PREB go high, thereby charging the bit line BLa1 to the voltage VA and the bit line BLb1 to the voltage VB. The voltage VA is set higher than the voltage VB. In this example, the voltage VA=1.8 V, the voltage VB=1.5 V. The selected control gate CG2 is set at 0 V, and the unselected control gates CG1, CG3 to CG8, and the selected gates SG1, SG2 are set at the power supply voltage Vcc. If the threshold value of the selected memory cell is negative, the potential on the selected bit line BLa1 will drop below the dummy bit-line voltage VB (reading data "1"). While, if the threshold value of the selected memory cell is positive, the potential on the bit line BLa1 is kept unchanged (reading data "0"). Flip-flop activating signals $\phi N$, $\phi P$ go low and high, respectively, and then equalize signal $\phi E$ goes high, thereby resetting the R/W circuit. The main bit-line select signals SA, SB go high, thereby connecting the R/W circuit to the select bit line BLa1 and dummy bit line BLb1. Flip-flop activating signal $\phi N$ goes high, and then $\phi P$ goes low, thereby allowing the potential of the selected bit line BLa1 to be sensed. The sensed potential is directly latched in the R/W circuit. Column select signal CSLi goes high, thereby outputting the data latched in the R/W circuit to the outside world via data input/output line IO. In FIG. 5, the following conditions are satisfied: RSTA2=Vcc, RSTB2= Vcc, PRA2=0 V, PRB2=0 V, VRFYA=0 V, VRFYB=0 V, $\phi$NW=Vcc, SS2=0 V, VRA=Vcc, VRB=Vcc, $\phi$DTCA=0 V, $\phi$DTCB=0 V, BLa2 (unselected, nondummy)=0 V, BLb2 (unselected, nondummy)=0 V.

Explained next will be the operation of writing data in the embodiment of the present invention. It is assumed that the bit line BLa1 and the control gate CG2 in the memory cell array 1a have been selected.

Figure 6:
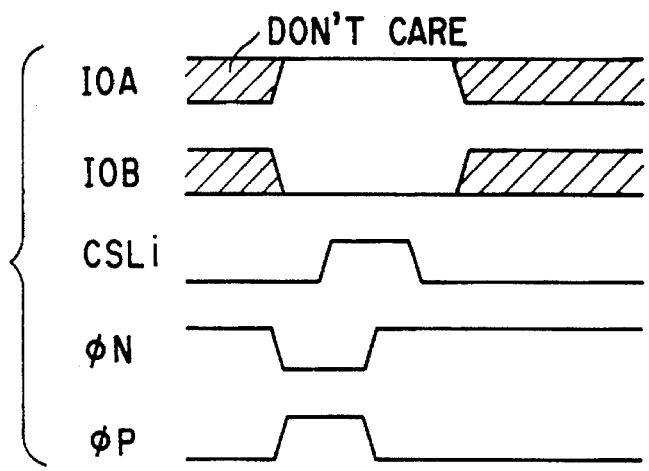
FIG. 6 is a timing chart for the operation of setting data in the main bit-line control circuit collectively in an embodiment of the present invention.
Figure 7:
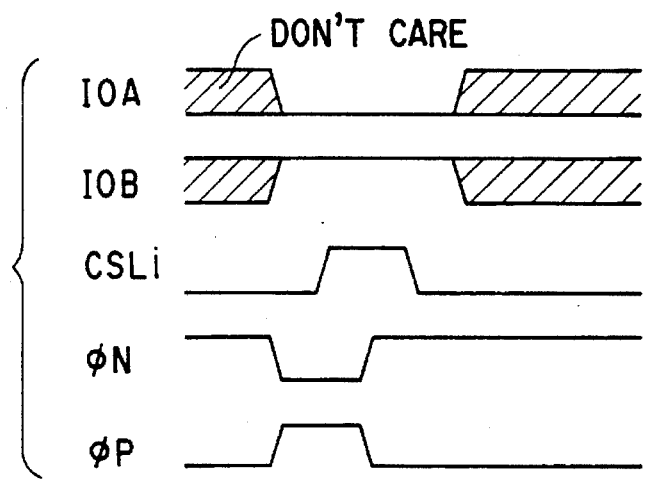
FIG. 7 is a timing chart for the operation of setting data in the main bit-line control circuit in unison in an embodiment of the present invention.
Figure 8:
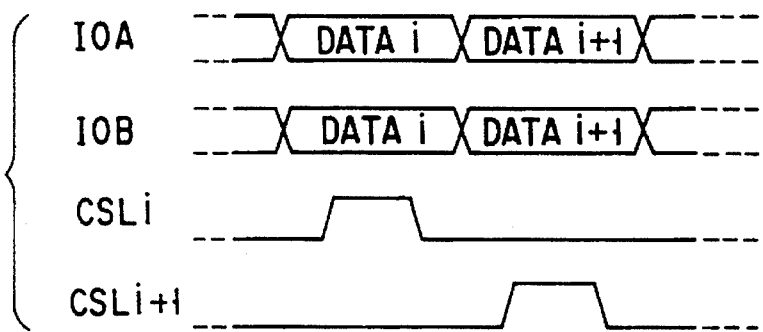
FIG. 8 is a timing chart for the operation of transferring data to the main bit-line control circuit in an embodiment of the present invention.

First, with reference to FIGS. 6, 7 and 8, a loading operation of the write data will be explained. The write data is transferred to only the R/W circuit corresponding to the column address to be rewritten. In order that the data in the memory cells may not be rewritten, writing data "1" is automatically set to the R/W circuits for the column addresses to which the data has not been transferred. As shown in FIG. 6, writing data "1" is set at all the column addresses including redundant columns before data transfer. Data input/output lines IOA, IOB go high and low, respectively. Furthermore, flip-flop activating signals φN, φP go low and high, respectively, thereby making the flip-flop inactive. All column address signals and column select activating signal CENB go high, and φN, φP go high and low, respectively, thereby setting the writing data "1" at all column addresses. When the select bit line is the BLb1, data input/output lines IOA, IOB go low and high, respectively, as shown in FIG. 7. After the writing data "1" has been set automatically, data transfer is effected according to the column address signal as shown FIG. 8.

Next, with reference to a timing chart in FIG. 9, a leakage detection operation of the EEPROM constructed aboved will be explained. In the NAND-cell type EEPROM, nearly 8 V is applied to the bit line during a "1" writing operation, as explained later. Because this voltage is raised by the booster circuit, a leakage current at the boosted circuit prevents the voltage to be raised to the desired level. To avoid this problem, as described earlier, after the data has been transferred, the bit line with a current leak is sensed before a write operation, and the data to be written into the R/W circuits corresponding to the bit line is made "0". This operation is shown in FIG. 9. The leakage detection operation resembles the read operation except that neither control gate CG nor select gate SG are selected. The selected bit line BLa1 is selectively precharged by signal VRFYA going high, according to the writing data to be written into the R/W circuit. When the write data to be written into the R/W circuit is "1", the selected bit line BLa1 will be precharged. On the contrary, when the write data is "0", it will not be precharged. In the case of the bit line BLa1 with a current leakage, its potential will drop due to the leakage even if precharging is effected. Therefore, when the bit line BLa1 is sensed, the write data is latched again without any change in the R/W circuits corresponding to the bit lines with no current leak. In the R/W circuit corresponding to the bit line with the current leakage, the write data "1" is changed, and the write data "0" is latched. Of course, when the original data in the R/W circuit is the write data "0", it will not be changed. In summary, when the write data in the data circuits is "0" after data are loaded, the bit line is brought into a low floating state. While, when the write data in the data circuits is "1," the bit line is forced to a high floating state. Since the high floating state of the bit line with the current leak source is changed to a low level, the data obtained by sensing the bit-line voltage is set in the data circuits as a writing data item after the current leakage time has elapsed. In this way, since the bit line with the current leak source is automatically checked after data are loaded, the write data are changed if the current leakages are detected, and the write operation is immediately followed. In FIG. 9, the following conditions are met: VA=0 V, φDTCA=0 V, φDTCB=0 V, PREA=0 V, PRA2=0 V, PRB2=0 V, RSTA2=Vcc, RSTB2=Vcc, SS2=0 V, VRFYB=0 V, VRB=Vcc, φNW=Vcc, CSLi=0 V, BLa2 (unselected, nondummy)=0 V, BLb2 (unselected, nondummy)=0 V, CG=0 V, SG1=0 V, SG2=0 V.

Figure 10:
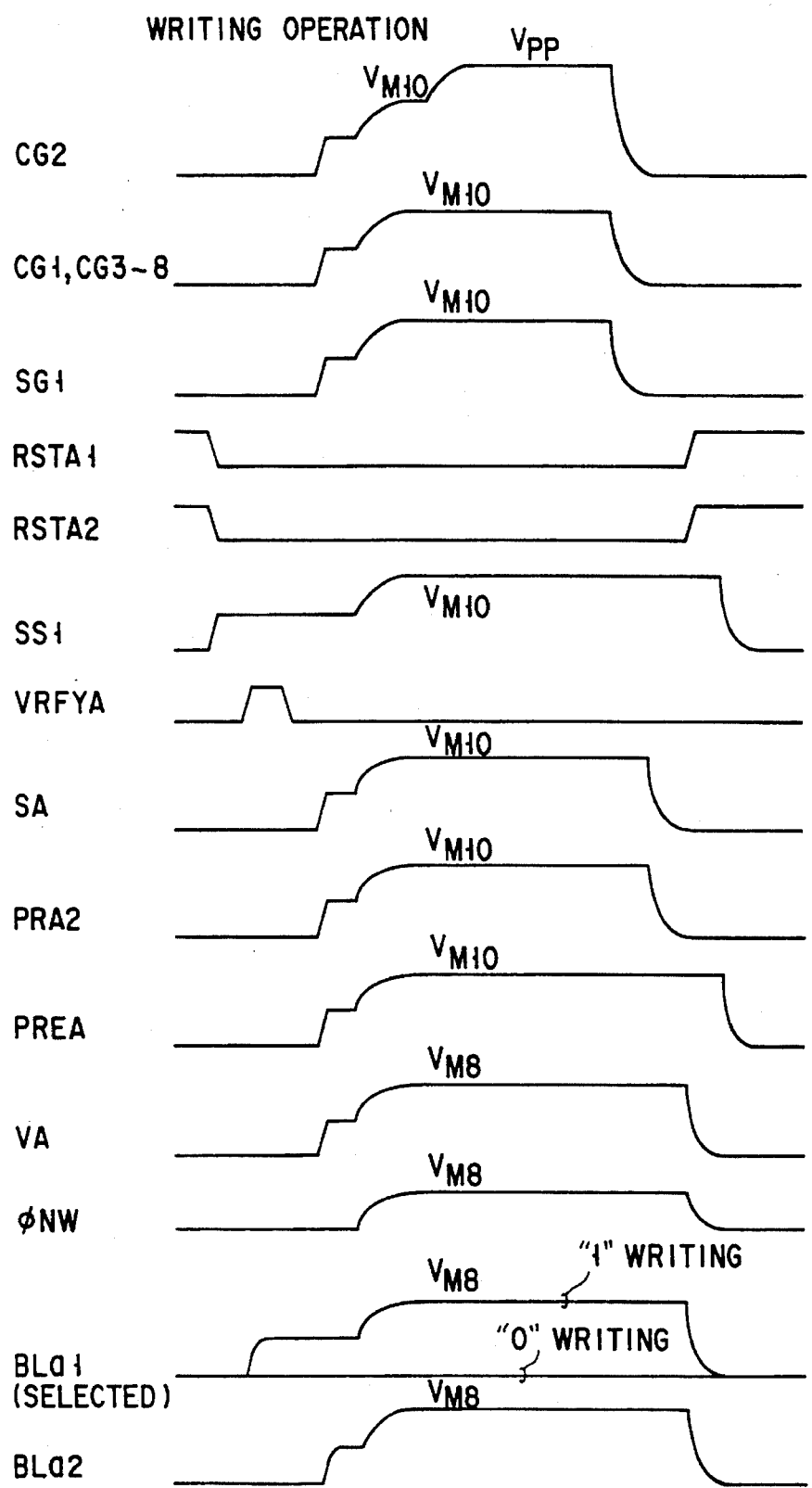
FIG. 10 is a timing chart for the write operation in an embodiment of the present invention.

As shown in a timing chart in FIG. 10, an ordinary write operation of the present embodiment is performed. When bit-line reset signals RSTA1, RSTA2 go low, auxiliary bit-line select signal SS1 goes high, and signal VRFYA goes high, the bit line BLa1 is precharged according to the data in the R/W circuit. Then, the main bit-line select signal SA goes high, causing the bit line BLa1 to be connected to the R/W circuit. In addition, the auxiliary bit-line precharge signal PRA2 and the main bit-line precharge signal PREA go high, allowing unselected bit line BLa2 to be precharged. When signals SS1, SA, PRA2, PREA are raised to the voltage Vm10 (up to 10 V) and the voltage VA and the power supply φNW for the R/W circuit are raised to the voltage Vm8 (up to 8 V), the bit line BLa1 goes to the voltage Vm8 during a "1" writing operation, and to 0 V during a "0" writing operation. The unselected bit line BLa2 is forced to the voltage Vm8 so that the memory cell may not be written into. The selected control gate CG2 is forced to the power supply voltage Vpp (up to 20 V). In this case, if the bit line is at 0 V, the threshold value of the memory cell shifts to the positive.

As explained above, during the write operation, by setting the bit-line fuse and the write data in the R/W circuit corresponding to the bit line with a current leak at "0", the booster voltage of the voltage Vm8 is prevented from dropping due to the bit line with a current leak. In FIG. 10, the following conditions are met: φDTCA=0 V, φDTCB=0 V, VB=0 V, PREB=0 V, PRA1=0 V, PRB1=0 V, PRB2=0 V, RSTB1=Vcc, RSTB2=Vcc, SS2=0 V, SB=0 V, VRFYB=0 V, VRA=Vcc, VRB=Vcc, φN=Vcc, φP=0 V, φE=0 V, VHL=0 V, CSLi=0 V, SG2=0 V.

Figure 11:
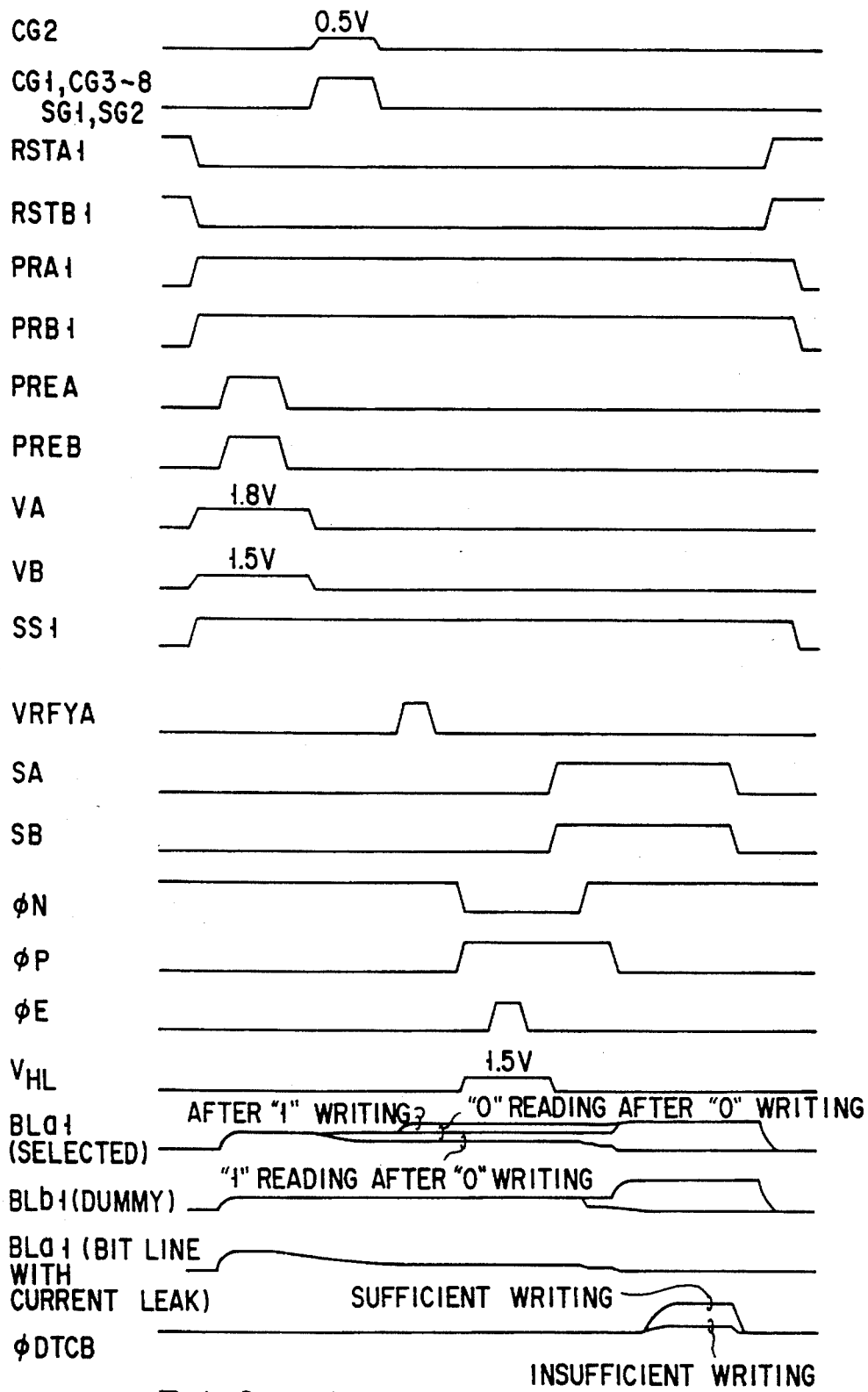
FIG. 11 is a timing chart for the write verify operation in an embodiment of the present invention.

Then, with reference to a timing chart in FIG. 11, a verify read operation after the write operation in the embodiment will be explained. The verify read operation is similar to the read operation except that the selected control gate CG2 is set at a verify voltage (e.g., 0.5 V) and that VRFYA goes high before flip-flop activating signals φN, φP go low and high, respectively. This causes the rewriting data to be converted as shown below. Then, additional writing is effected only for a memory cell into which the data has been written insufficiently.

| Writing data       | 0 0 1 1 |
| Data in memory cell | 0 1 0 1 |
| Rewriting data     | 1 0 1 1 |

In this case, the rewrite data in the R/W circuit corresponding to the bit line having the current leakage also becomes "0", thereby preventing the booster voltage of the voltage Vm8 from dropping even during a rewrite operation. After the verify read operation, the sense signal line φDTCB is activated so that, if the voltages on all of the dummy bit lines are 0 V, they may be forced high to sense whether the write operation has been completed. In the defective column, the bit-line fuse prevents erroneous sensing as described earlier. In FIG. 11, the following conditions are satisfied: RSTA2= Vcc, RSTB2=Vcc, PRA2=0 V, PRB2=0 V, VRFYB=0 V, φNW=Vcc, SS2=0 V, VRA=Vcc, VRB=Vcc, φDTCA=0 V, CSLi=0 V, BLa2 (unselected, nondummy)=0 V, BLb2 (unselected, nondummy)=0 V.

Figure 12:
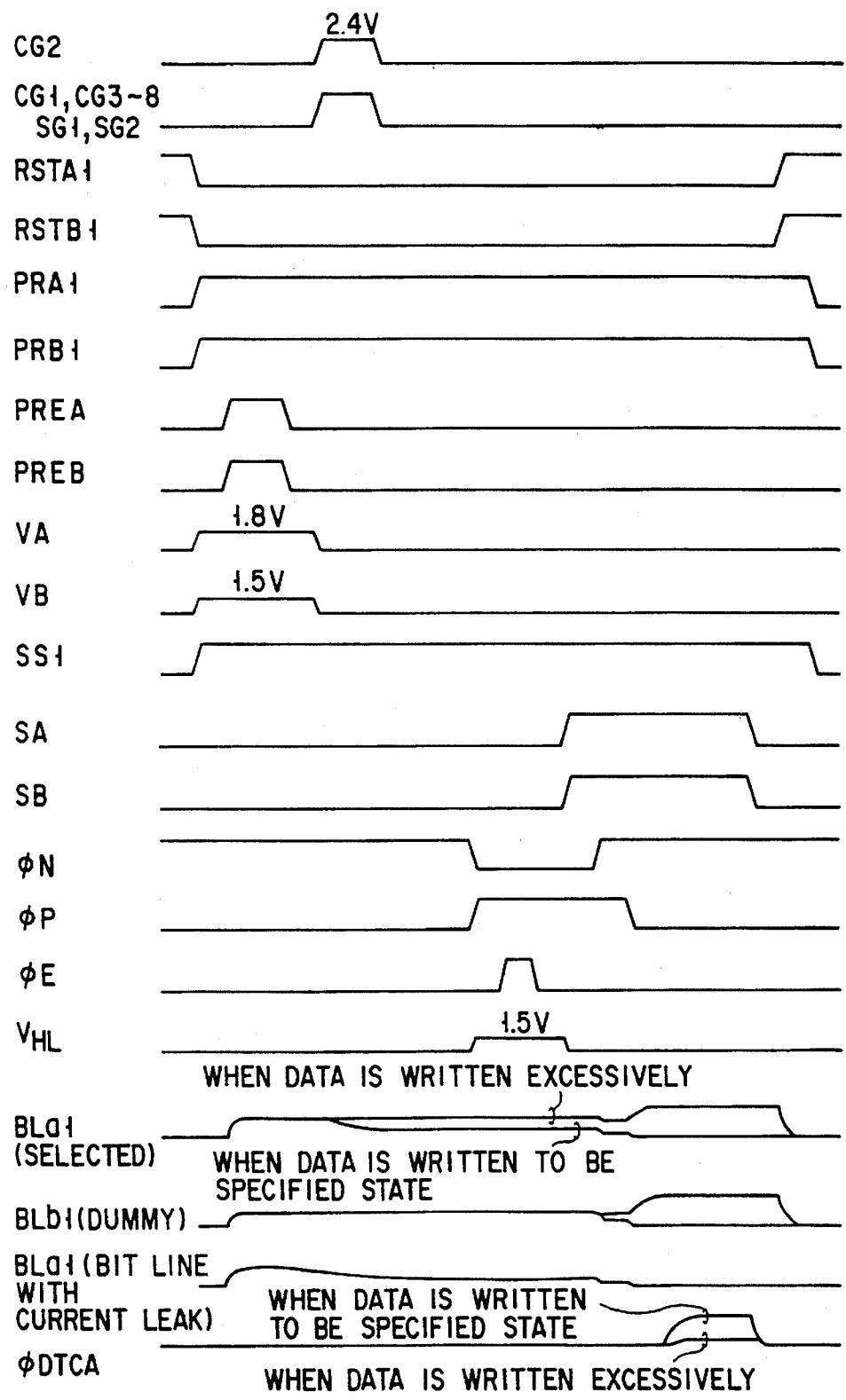
FIG. 12 is a timing chart for the operation of sensing excessive writing in an embodiment of the present invention.

FIG. 12 is a timing chart showing an excessive write sensing and reading operation after a write end has been sensed. The excessive write sensing and reading operation is similar to the read operation except that the selected control gate CG2 is placed at an excessive writing sense voltage, e.g., 2.4 V. This makes it possible to sense the memory cell into which data is written excessively and whose threshold value is 2.4 V or more. When the sense signal line φDTCA goes low, an excessive write relief operation starts. In this case, for the excessive write relief data in the R/W circuit corresponding to a bit line with a current leak, the booster voltage of the voltage vm8 is also prevented from dropping during the excessive write relief operation. In FIG. 12, the following conditions are met: RSTA2=Vcc, RSTB2=Vcc, PRA2=0 V, PRB2=0 V, VRFYA=0 V, VRFYB=0 V, φNW= Vcc, VRA=Vcc, VRB=Vcc, φDTCB=0 V, CSLi=0 V, SS2=0 V, BLa2 (unselected, nondummy)=0 V, BLb2 (unselected, nondummy)= 0 V.

Figure 13:
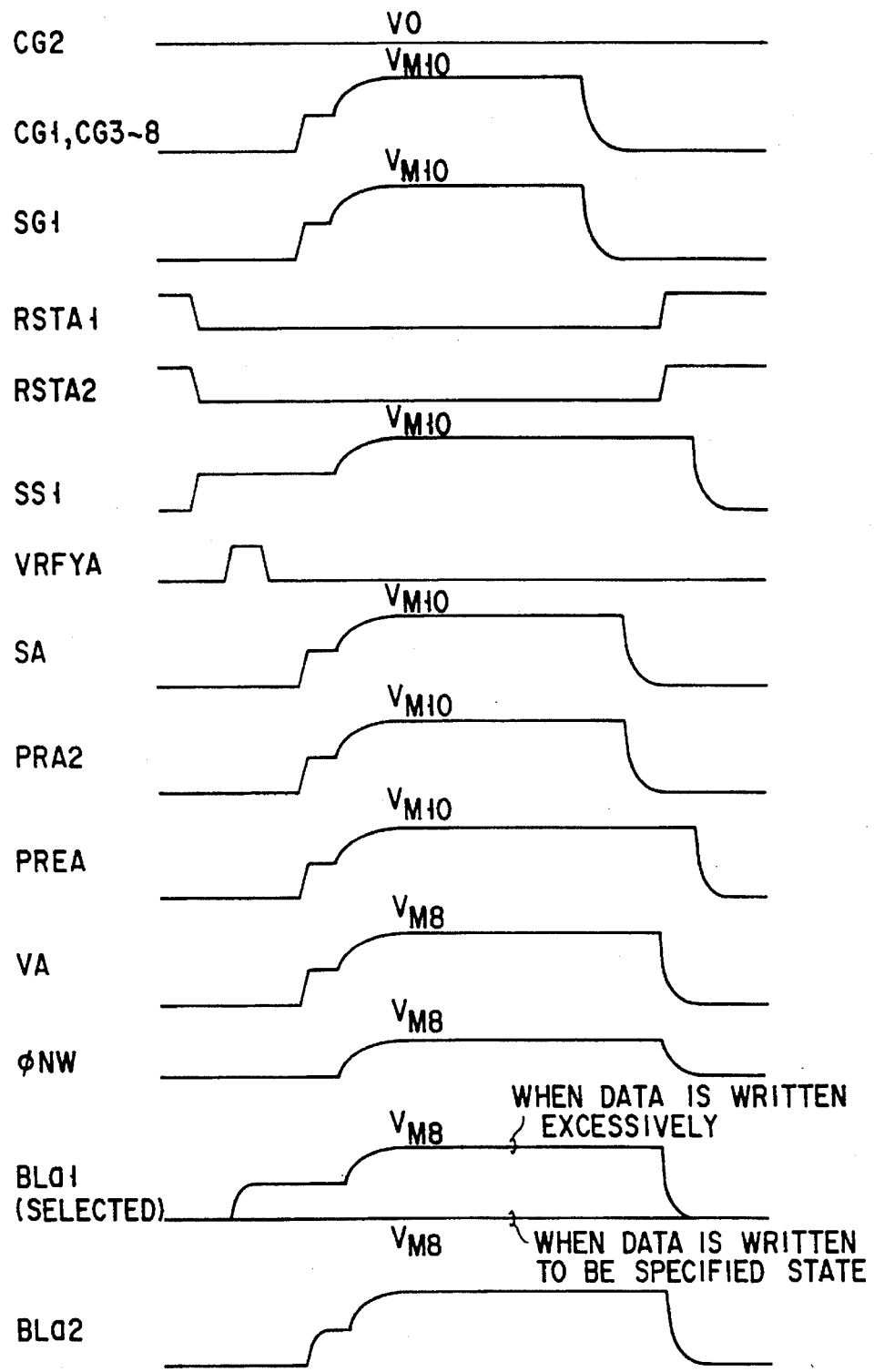
FIG. 13 is a timing chart for the operation of relieving excessive writing in an embodiment of the present invention.

FIG. 13 is a timing chart showing an excessive writing relief operation. The excessive writing relief operation is similar to the write operation except that the selected control gate CG2 is set at 0 V. This causes the threshold value of the memory cell into which data is written excessively to shift to the negative side to return to a specified value. Here, the bit line of the memory cell into which data is written excessively is set at the voltage vm8, and the bit line of the memory cell in which data is not excessively written is forced at 0 V. When the bit line of the not excessively written memory cell is set at the middle value between the voltage of the selected control gate CG2, i.e., 0 V in this case, and the voltage on the bit line, i.e., vm8 in this case, of the excessively written memory cell, this will produce better results. In FIG. 13, the following conditions are satisfied: φDTCA=0 V, φDTCB=0 V, VB=0 V, PREB=0 V, PRA1=0 V, PRB1=0 V, PRB2=0 V, RSTB1=Vcc, RSTB2=Vcc, SS2=0 V, SB=0 V, VRFYB=0 V, VRA=Vcc, VRB=Vcc, φN=Vcc, φP=0 V, φE=0 V, VHL=0 V, CSLi=0 V, SG2=0 V.

Figure 14:
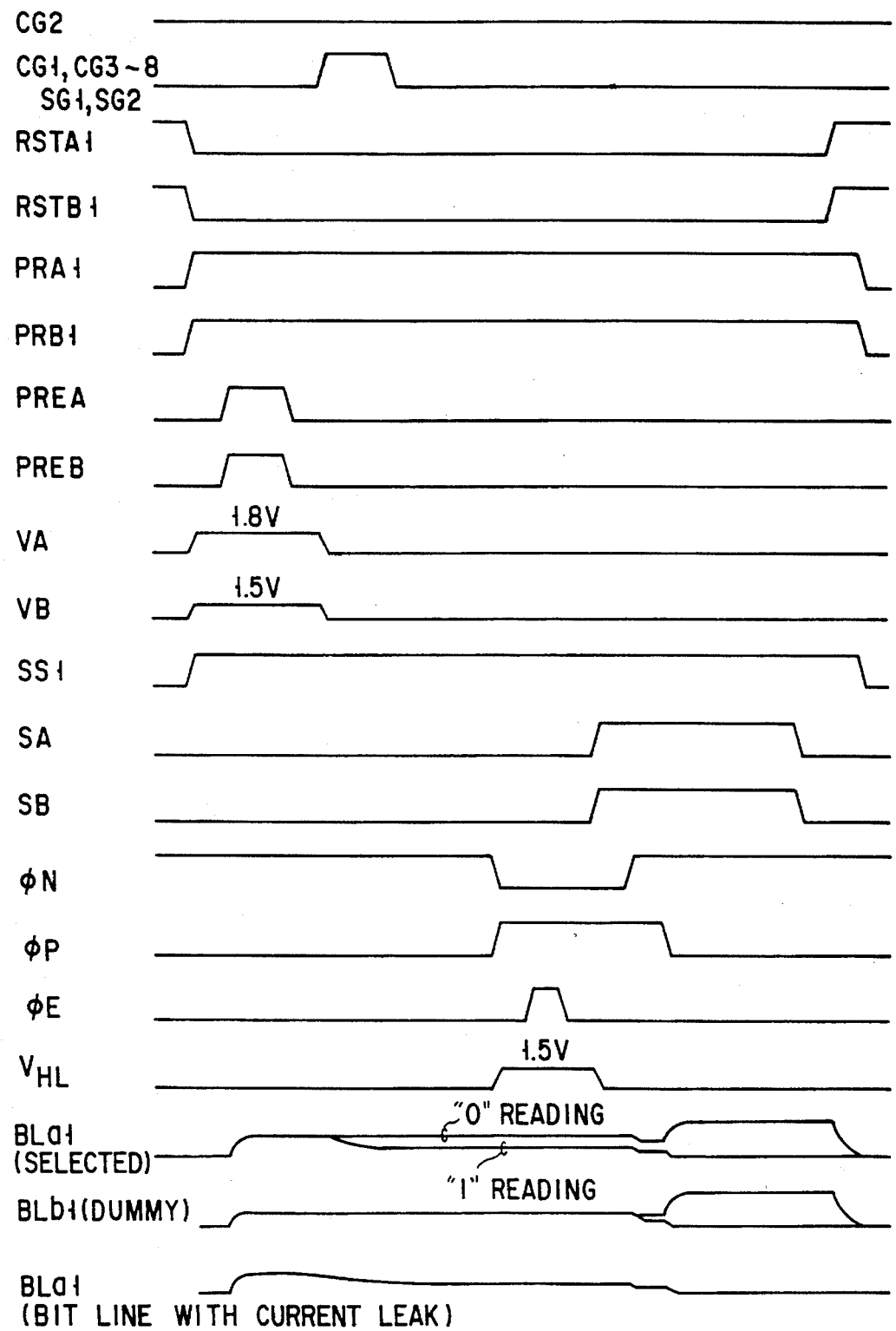
FIG. 14 is a timing chart for the copy data read operation in an embodiment of the present invention.
Figure 15:
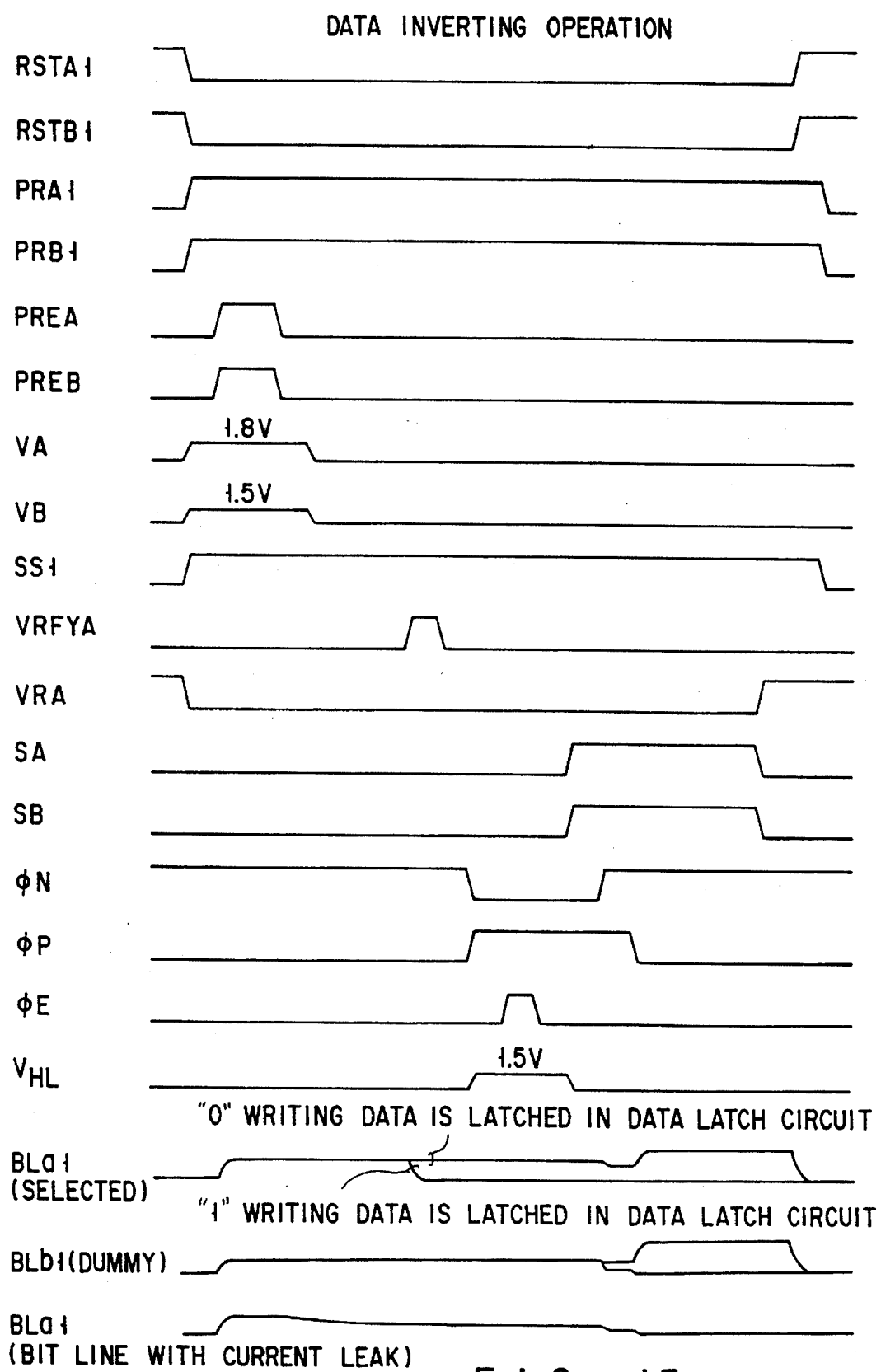
FIG. 15 is a timing chart for the operation of reversing data in an embodiment of the present invention.

FIGS. 14 and 15 are timing charts showing a write data setting operation used for a page copy operation. The write data are not only transferred from the input/output line IO before the write operation, but also are used in a copy function when one page of data in the memory cells sharing a control gate are copied to the memory cells of another page. The copy operation at this time will be described according to FIGS. 14 and 15. In FIG. 14, the following conditions are met: RSTA2=Vcc, RSTB2=Vcc, PRA2=0 V, PRB2=0 V, VRFYA=0 V, VRFYB=0 V, φNW=Vcc, CSLi=0 V, SS2=0 V, VRA=Vcc, VRB=Vcc, φDTCA=0 V, φDTCB=0 V, BLa2 (unselected, nondummy)=0 V, BLb2 (unselected, nondummy)=0 V. In FIG. 15, the following conditions are met: RSTA2=Vcc, RSTB2=Vcc, PRA2=0 V, PRB2=0 V, VRFYB=0 V, φNW=Vcc, SS2=0 V, VRB=Vcc, φDTCA=0 V, φDTCB=0 V, CLSi=0 V, BLa2 (unselected, nondummy)=0 V, BLb2 (unselected, nondummy)=0 V, CG=0 V, SG1=0 V, SG2=0 V.

First, as shown in a timing chart in FIG. 14, the read operation of the data is effected. For instance, when a page of memory cell array 1a is copied to a page of memory cell array 1b, writing is done according to the data latched in the R/W circuit after the reading. For instance, when a page of memory cell array la is copied to a page of the same memory cell array, the writing operation based on the data latched in the R/W circuit at this time causes an inversion of the data. To solve this problem, a data inversion operation is performed as shown in FIG. 15. The data inversion operation is similar to the verify read operation except that when neither the control gate nor the select gate is selected, and the signal VRFYA goes high, the voltage VRA is set at 0 V. This causes the data latched in the R/W circuit to be inverted, allowing the writing data in the R/W circuit corresponding only to the bit line with a current leak to be "0".

Figure 16:
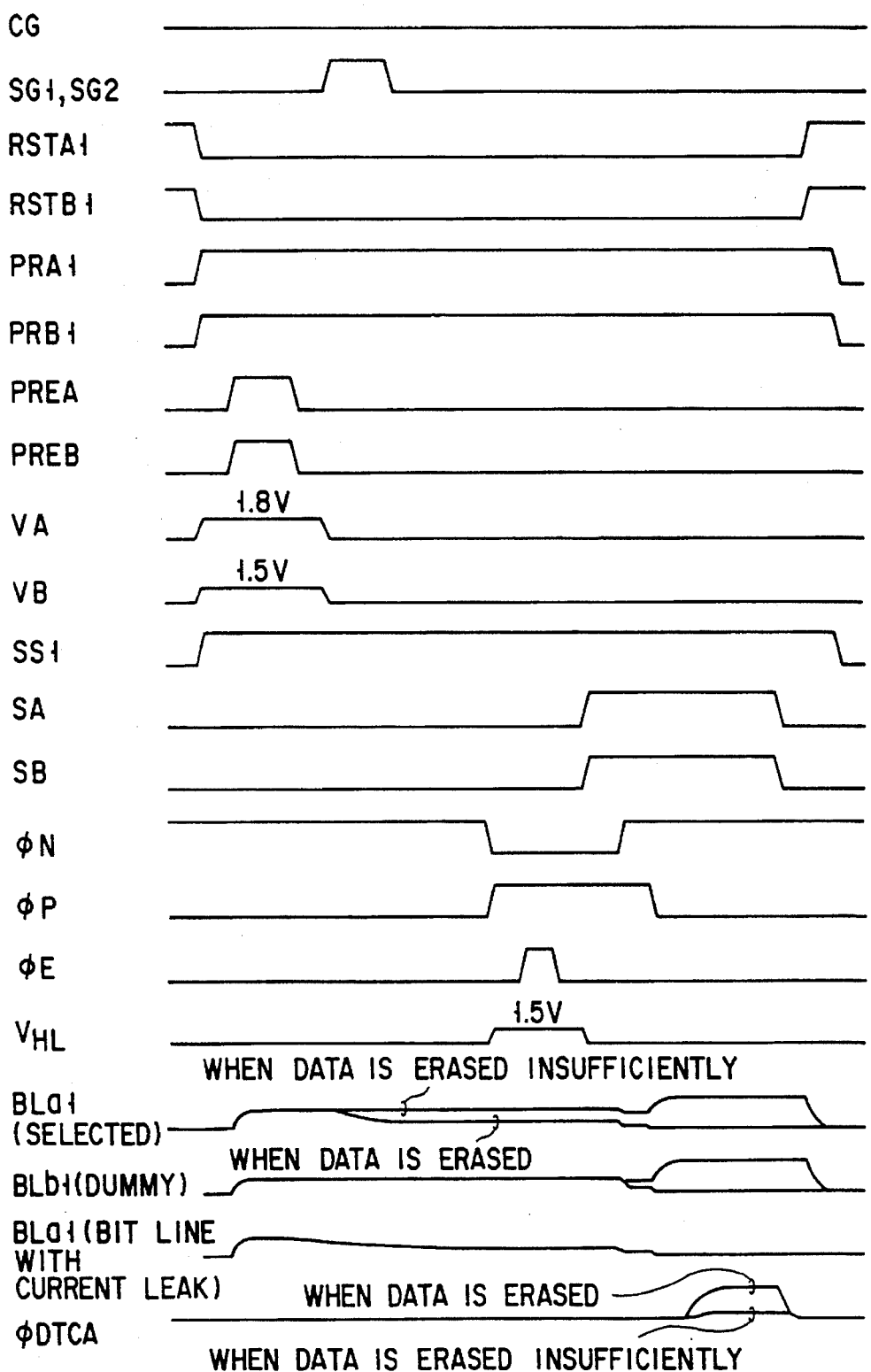
FIG. 16 is a timing chart for the erase verify operation in an embodiment of the present invention.

FIG. 16 is a timing chart showing an erase verify operation of the present embodiment. Data erasing is effected by applying the voltage Vpp to the P-substrate or the P-well and forcing the control gates CG1 to CG8 in the selected block at 0 V. The erase verify operation after the erasing operation is shown in FIG. 16. This erase verify operation is similar to the read operation except that control gates CG1 to CG8 are all set at the voltage 0 V. When none of the eight memory cells that are connected in series and constitute a NAND cell are erased, the low voltage is set on the sense signal line φDTCA, and then the erasing operation is effected again. In FIG. 16, the following conditions are met: RSTA2=Vcc, RSTB2=Vcc, PRA2=0 V, PRB2=0 V, VRFYB=0 V, φNW= Vcc, SS2=0 V, VRA=Vcc, VRB=Vcc, φDTCB=0 V, CLSi=0 V, BLa2 (unselected, nondummy)=0 V, BLb2 (unselected, nondummy)=0 V.

With the present embodiment, the bit line with a current leak is sensed with the write data latched in the R/W circuit, and the data in the R/W circuit corresponding to the bit line is set on the bit line automatically so that the output of the circuit with a small current supply capacity, such as the booster circuit, may not be applied to the bit line. In addition, fuses are used. All these combine to provide an EEPROM with a high bit-line relief efficiency. Specifically, because the bit line with a current leak is automatically checked after data are loaded and the write operation is immediately followed, it is possible to alleviate a burden on the CPU in the write mode. Data loading can be effected in a short time after the write mode has turned on. Therefore, it is possible to provide an easy-to-use NAND-cell type EEPROM with a high relief efficiency of defective bit lines.

While in the embodiment, a current leak is prevented by making the potential on a bit line with a current leak equal to the potential at the destination of the leakage current during the write operation, the electric potential on the bit line with the current leak during the write operation may be a power supply or a power supply circuit with a current supply capacity enough to overcome a current leak, as long as the write operation voltage for the good bit lines does not deviate from the correct value.

As described above in detail, with the present invention, a bit line with a current leak is automatically checked after data loading, immediately followed by a write operation, without checking a bit line with a current leak before the write mode is turned on or during the time from when the write mode is turned on until data loading. This allows data to be loaded in a short time after the write mode is turned on. Therefore, it is possible to realize an easy-to-use NAND-cell type EEPROM with a high relief efficiency of defective bit lines.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory device comprising:

a memory cell array in which electrically erasable programmable memory cells are arranged in a matrix fashion;

a plurality of bit lines coupled to said memory cells;

a plurality of data circuits for storing write data to control a state of a writing operation of said memory cells in said memory cell array;

means for detecting at least one defective bit line with a defect of a current leakage after write data have been loaded into said data circuits;

means for resetting write data corresponding only to said defective bit line among said write data in said data circuits; and means for performing a write operation by controlling a bit line potential for each memory cell in said memory cell array according to the contents of the corresponding data circuit.

2. A nonvolatile semiconductor memory device according to claim 1, wherein, after said write data are loaded, a bit line of said memory cell array is brought into a low floating state if said write data in said data circuits is "0", and said bit line is forced to a high floating state if said write data in said data circuits is "1";

said detecting means detects whether said bit line has said current leakage source by sensing that said high floating state of said bit line with the current leak source is changed to a low level;

said data resetting means resets said data obtained by sensing the bit-line voltage in said data circuits as said write data after a current leakage time has elapsed.

3. A nonvolatile semiconductor memory device according to claim 1, wherein said detecting means detects defective bit line with said defect of said current leakage by any one of a leakage detection operation, a verify read operation, an excessive write sensing read operation, a copy data read operation, a data inversion operation, and an erase verify operation.

4. A nonvolatile semiconductor memory device according to claim 1, wherein said data resetting means is provided with a bit-line voltage setting circuit for setting a bit line to one of first and second bit-line read voltages;

each of said data circuit is composed of a CMOS flip-flop, one terminal of which being connected to said bit line via a switching MOS transistor;

said bit-line voltage setting circuit is connected to said bit line and receives the output of the CMOS flip-flop acting as the data circuit;

said CMOS flip-flop outputs a write bit-line voltage on said bit line via said switching MOS transistor; and said CMOS flip-flop senses said bit-line voltage after said bit-line voltage setting circuit has operated, stores the sensed voltage, and effects data resetting.

5. A nonvolatile semiconductor memory device according to claim 4, wherein the output terminal of said CMOS flip-flop for outputting a write bit-line voltage also serves as the input terminal of said CMOS flip-flop for sensing said bit-line voltage.

6. A nonvolatile semiconductor memory device according to claim 1, wherein said memory cell is composed of a charge storage layer and a control gate stacked in sequence on a semiconductor substrate, and plural of said memory cells are connected in series in columns to form a NAND cell structure.

7. A nonvolatile semiconductor memory device comprising:

a memory cell array in which electrically erasable programmable memory cells are arranged in a matrix fashion;

a plurality of bit lines coupled to said memory cells;

data circuits for storing write data such data as to set a selected bit line of said plurality of bit lines at one of a first write bit-line voltage or a second write bit-line voltage during a write operation, to control writing conditions of said memory cells in said memory cell array;

means for detecting at least one defective bit line with a defect of a current leakage after write data have been loaded into said data circuits;

means for resetting write data corresponding only to said defective bit line among said write data in said data circuits to such data as to set a bit line at one of the first write bit-line voltage or the second bit-line voltage during a write operation; and means for performing a write operation by controlling the bit line potential for each memory cell in said memory cell array according to the contents of the corresponding data circuit.

8. A nonvolatile semiconductor memory device according to claim 7, wherein, after said write data are loaded, a bit line of said memory cell array is brought into a low floating state if said write data in said data circuits is "0", and said bit line is forced to a high floating state if said write data in said data circuits is "1";

said detecting means detects whether said bit line has said current leakage source by sensing that said high floating state of said bit line with the current leak source is changed to a low level; and said data resetting means resets said data obtained by sensing the bit-line voltage in said data circuits as said write data after a current leakage time has elapsed.

9. A nonvolatile semiconductor memory device according to claim 7, wherein said detecting means detects defective bit line with said defect of said current leakage by any one of a leakage detection operation, a verify read operation, an excessive write sensing read operation, a copy data read operation, a data inversion operation, and an erase verify operation.

10. A nonvolatile semiconductor memory device according to claim 7, wherein said first write bit-line voltage is equal to the voltage at the destination circuit of a leakage current from said defective bit line with said current leakage or is the output of a power supply or a power supply circuit with a current supply capacity enough to deal with said leakage current from said defective bit line with said current leakage.

11. A nonvolatile semiconductor memory device according to claim 7, wherein said data resetting means is provided with a bit-line voltage setting circuit for setting a bit line to one of first and second bit-line read voltages;

each of said data circuits is composed of a CMOS flip-flop, one terminal of which being connected to said bit line via a switching MOS transistor;

said bit-line voltage setting circuit is connected to said bit line and receives the output of the CMOS flip-flop acting as the data circuit;

said CMOS flip-flop outputs a write bit-line voltage on said bit line via said switching MOS transistor; and said CMOS flip-flop senses said bit-line voltage after said bit-line voltage setting circuit has operated, stores the sensed voltage, and effects data resetting.

12. A nonvolatile semiconductor memory device according to claim 11, wherein the output terminal of said CMOS flip-flop for outputting a write bit-line voltage also serves as the input terminal of said CMOS flip-flop for sensing said bit-line voltage.

13. A nonvolatile semiconductor memory device according to claim 7, wherein said memory cell is composed of a charge storage layer and a control gate stacked in sequence on a semiconductor substrate, and plural of said memory cells are connected in series in columns to form a NAND cell structure.

14. A nonvolatile semiconductor memory device comprising:

a memory cell array in which electrically erasable programmable memory cells are arranged in a matrix fashion and coupled to bit lines;

a plurality of data circuits for storing data to control writing conditions of said memory cells in said memory array and for sensing the voltages on bit lines of said memory cell array and storing the sensed voltages again;

means for detecting at least one defective bit line with a defect of a circuit leakage after-data have been loaded into said data circuits;

means for replacing the contents of said data circuits corresponding only to said defective bit lines with a current leak with such a data item as causes the write operation performing means to set said bit line at the first write bit-line voltage during a write operation, and not changing the contents of the data circuits corresponding to the bit lines with no current leakage when said data circuits sense said voltages on said bit lines and store the sensed voltages again; and means for performing a write operation by controlling the bit line potential for each memory cell in said memory cell array according to the contents of the corresponding data circuit.

15. A nonvolatile semiconductor memory device according to claim 14, wherein said data resetting means is provided with a bit-line voltage setting circuit for setting a bit line to a first or a second bit-line read voltage;

said first and second bit-line read voltages are set so that a defective bit line with a current leakage may be forced at the second bit-line read voltage regardless of the contents of the data circuit; and said write operation performing means sets said bit line at the first write bit-line voltage during a write operation when the data circuit senses the second bit-line read voltage on a bit line and stores the sensed voltage again.

16. A nonvolatile semiconductor memory device according to claim 14, wherein, after said write data are loaded, a bit line of said memory cell array is brought into a low floating state if said write data in said data circuits is "0", and said bit line is forced to a high floating state if said write data in said data circuits is "1";

said detecting means detects that said bit line has said current leakage source by sensing that said high floating state of said bit line with the current leak source is changed to a low level; and said data resetting means resets said data obtained by sensing the bit-line voltage in said data circuits as said write data after a current leakage time has elapsed.

17. A nonvolatile semiconductor memory device according to claim 14, wherein said detecting means detects defective bit lines with said defect of said current leakage by any one of a leakage detection operation, a verify read operation, an excessive write sensing read operation, a copy data read operation, a data inversion operation, and an erase verify operation.

18. A nonvolatile semiconductor memory device according to claim 14, wherein said data resetting means is provided with a bit-line voltage setting circuit for setting a bit line to one of first and second bit-line read voltages;

each of said data circuits is composed of a CMOS flip-flop, one terminal of which being connected to said bit line via a switching MOS transistor;

said bit-line voltage setting circuit is connected to said bit line and receives the output of the CMOS flip-flop acting as the data circuit;

said CMOS flip-flop outputs a write bit-line voltage on said bit line via said switching MOS transistor; and said CMOS flip-flop senses said bit-line voltage after said bit-line voltage setting circuit has operated, stores the sensed voltage, and effects data resetting.

19. A nonvolatile semiconductor memory device according to claim 18, wherein the output terminal of said CMOS flip-flop for outputting a write bit-line voltage also serves as the input terminal of said CMOS flip-flop for sensing said bit-line voltage.

20. A nonvolatile semiconductor memory device according to claim 14, wherein said memory cell is composed of a charge storage layer and a control gate stacked in sequence on a semiconductor substrate, and plural of said memory cells are connected in series in columns to form a NAND cell structure.

* * * * *